(12) United States Patent
Kim et al.

(10) Patent No.: US 7,145,253 B1
(45) Date of Patent: Dec. 5, 2006

(54) ENCAPSULATED SENSOR DEVICE

(75) Inventors: Tae Soo Kim, Seoul (KR); Young Hyo Eun, Seoul (KR); Jicheng Yang, Gilbert, AZ (US); Jong Wook Park, Seoul (KR); David DoSung Chun, Tempe, AZ (US); Hee Yeoul Yoo, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/865,096

(22) Filed: Jun. 9, 2004

(51) Int. Cl.
*H01L 23/29* (2006.01)

(52) U.S. Cl. .................. 257/790; 257/417; 257/432; 257/433; 257/787

(58) Field of Classification Search ............. 257/417, 257/432–434, 787–790
See application file for complete search history.

(56) References Cited

U.S. PATENT DOCUMENTS

| | | | |
|---|---|---|---|
| 3,880,528 A | 4/1975 | Petersen et al. | 356/225 |
| 4,055,761 A | 10/1977 | Shimomura | 250/239 |
| 5,266,827 A * | 11/1993 | Kato | 257/417 |
| 5,386,342 A * | 1/1995 | Rostoker | 361/749 |
| 5,444,520 A | 8/1995 | Murano | 355/229 |
| 5,821,532 A | 10/1998 | Beaman et al. | 250/239 |
| 6,011,661 A | 1/2000 | Weng | 359/819 |
| 6,037,655 A | 3/2000 | Philbrick et al. | 257/680 |
| 6,049,120 A * | 4/2000 | Otani et al. | 257/667 |
| 6,060,722 A | 5/2000 | Havens et al. | 250/566 |
| 6,323,529 B1 * | 11/2001 | Nagahara | 257/420 |
| 6,384,472 B1 | 5/2002 | Huang | 257/680 |
| 6,441,503 B1 * | 8/2002 | Webster | 257/787 |
| 6,762,077 B1 | 7/2004 | Schuurmans et al. | 438/112 |
| 6,767,753 B1 | 7/2004 | Huang | 438/25 |
| 6,917,089 B1 | 7/2005 | Schuurmans et al. | 257/427 |
| 6,949,405 B1 * | 9/2005 | Hagen | 438/106 |

FOREIGN PATENT DOCUMENTS

| | | |
|---|---|---|
| GB | 1022329 | 3/1966 |
| WO | WO 93/22787 | 11/1993 |

* cited by examiner

*Primary Examiner*—Gene M. Munson
(74) *Attorney, Agent, or Firm*—Gunnison, McKay & Hodgson, L.L.P.; Serge J. Hodgson

(57) ABSTRACT

Disclosed is a semiconductor device and its manufacturing method. By way of example, the semiconductor device includes a semiconductor die for sensing an external physical quantity, an insulating gel covering the semiconductor die, and an encapsulant which covers the insulating gel while the insulating gel is partially exposed to the exterior. Also, another semiconductor device further includes a dummy plate which has a hole and is seated on the insulating gel. In the manufacturing method of a semiconductor device, a mold having a through hole is provided and the through hole include a structure consisting of a movable pin and a spring for absorbing the expansion of the insulating gel during an encapsulation process. Also, another manufacturing method of a semiconductor device includes performing the encapsulation while the dummy plate is seated on the insulating gel.

17 Claims, 15 Drawing Sheets

ENCAPSULATED SENSOR DEVICE

BACKGROUND OF THE INVENTION

1. Field of the Invention

The present invention relates to a semiconductor device and its manufacturing method.

2. Description of Related Art

In general, a semiconductor device for sensing an external physical quantity (pressure, temperature, mass, etc.) should be so designed that the external physical quantity is intactly transmitted to a semiconductor die or a microelectromechanical system (MEMS) sensor and is simultaneously protected from external stresses. For this purpose, a MEMS sensor sensing an external physical quantity is usually coated with a very soft insulating gel, and all of the remaining regions, such as a semiconductor die, a substrate or the like, are encapsulated with a hard encapsulant. As the case may be, of course, a certain region of the insulating gel needs to be exposed to the exterior so that an external physical quantity can be intactly transmitted to the MEMS sensor through the encapsulant.

In such a case where the insulating gel needs to be exposed, the conventional encapsulating method has a problem in that the size and shape of the insulating gel exposed through the encapsulant becomes irregular due to the volume and the tolerance for height of the insulating gel.

Also, in order to perform an encapsulation process while an insulating gel is opened, a mold formed with a through hole may be used. However, forming the through hole in the mold itself is very difficult.

Furthermore, if the temperature of the semiconductor device falls to a normal temperature (25° C.) after the high-temperature encapsulation process, the insulating gel, which has been expanded by the temperature of mold (175° C.), shrinks its volume, so that height of the insulating gel is lowered to less height than that of the formed encapsulant. This phenomenon causes delamination between the insulating gel and the encapsulant, etc., thereby considerably deteriorating the reliability of the semiconductor device.

SUMMARY OF THE INVENTION

Disclosed is a semiconductor device and its manufacturing method. By way of example, the semiconductor device includes a semiconductor die for sensing an external physical quantity, an insulating gel covering the semiconductor die, and an encapsulant, which covers the insulating gel while the insulating gel is partially exposed to the exterior. Also, another semiconductor device further includes a dummy plate, which has a hole and is seated on the insulating gel. In the manufacturing method of a semiconductor device, a mold having a through hole is provided and the through hole include a structure consisting of a movable pin and a spring for absorbing the expansion of the insulating gel during an encapsulation process. Also, another manufacturing method of a semiconductor device includes the operation of performing the encapsulation while the dummy plate is seated on the insulating gel. In this way, by providing a mold with the movable pin which compresses the spring and moves against a spring force or providing the dummy plate on the insulating gel, the size and shape of the insulating gel exposed to the exterior through the encapsulant or the dummy plate becomes regular.

Embodiments in accordance with the present invention will be more apparent from the following detailed description taken in conjunction with the accompanying drawings.

BRIEF DESCRIPTION OF THE DRAWINGS

Common reference numerals are used throughout the drawings and the detailed description to indicate the same or similar elements.

DETAILED DESCRIPTION

Figure 1A:
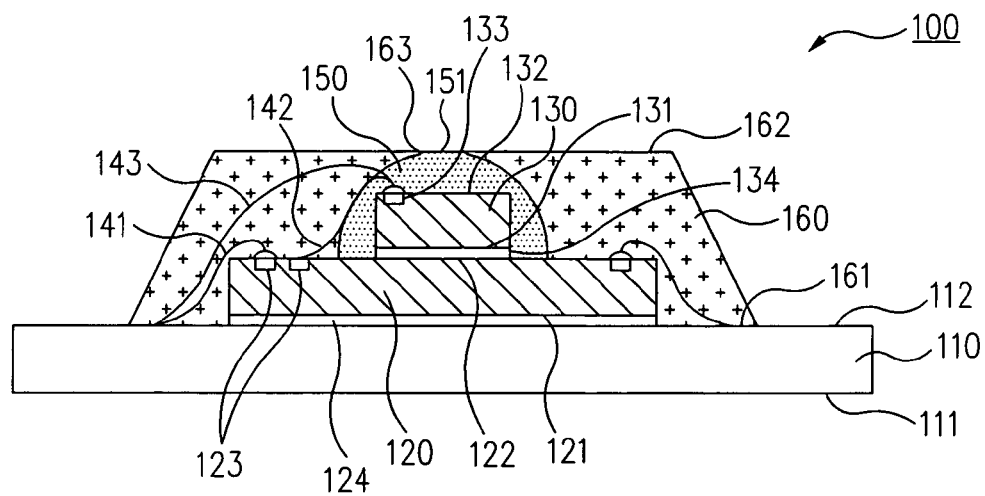
FIGS. 1A and 1B are a sectional view and a plan view of a semiconductor device in accordance with one embodiment of the present invention, respectively.
Figure 1B:
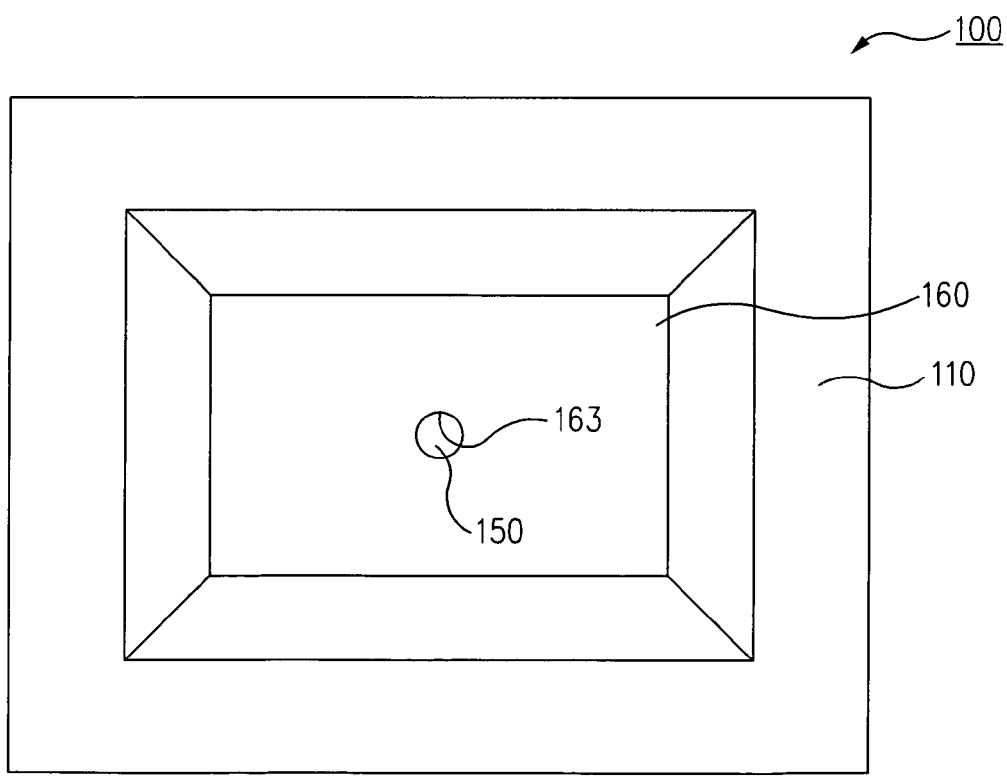

Referring to FIGS. 1A and 1B, a semiconductor device 100 in accordance with one embodiment of the present invention is shown in a sectional view and a plan view, respectively.

As shown in these drawings, the semiconductor device 100 of the present invention includes a substrate 110, a first semiconductor die 120 bonded to the substrate 110, a second semiconductor die 130 bonded to the first semiconductor die 120, pluralities of first conductive wires 141 connecting the first semiconductor die 120 to the substrate 110, pluralities of second conductive wires 142 connecting the first semiconductor die 120 to the second semiconductor die 130, an insulating gel 150 surrounding the second semiconductor die 130, and an encapsulant 160 surrounding all of the substrate 110, the first and second semiconductor dies 120, 130, the first and second conductive wires 141, 142 and the insulating gel 150.

The substrate 110 has a first substantially flat surface 111 and a second substantially flat surface 112 opposite to the first flat surface 111. This substrate 110 may be a lead frame, a printed circuit board, a circuit film, a circuit tape or their equivalents, but its type need not be limited to these.

The first semiconductor die 120 has a first substantially flat surface 121 and a second substantially flat surface 122 opposite to the first flat surface 121. Also, pluralities of bond pads 123 are formed at edges of the second surface 122. Moreover, the first surface 121 of the first semiconductor die 120 is bonded to the second surface 112 of the substrate 110 by means of an adhesive layer 124.

The second semiconductor die 130 has a first substantially flat surface 131 and a second substantially flat surface 132 opposite to the first flat surface 131. Also, pluralities of bond pads 133 are formed at edges of the second surface 132. Moreover, the first surface 131 of the second semiconductor die 130 is bonded to the second surface 122 of the first semiconductor die 120 by means of an adhesive layer 134. Such a second semiconductor 130 may be a MEMS sensor for sensing an external physical quantity. For example, the second semiconductor die 130 can be a pressure sensor for sensing pressure. Also, the second semiconductor die 130 has relatively smaller width than that of the first semiconductor die 120. This is intended to prevent mutual short-circuit and interference of the second semiconductor die 130 and the first conductive wires 141. In some cases, however, the mutual interference of the second semiconductor die 130 and the first conductive wires 141 can be avoided by increasing the thickness of the adhesive layer 134. In this case, the width of the second semiconductor die 130 can be the same as or larger than that of the first semiconductor die 120.

The pluralities of first conductive wires 141 electrically connects the bond pads 123 of the first semiconductor die 120 and the substrate 110 to each other. For example, one end of the first conductive wire 141 can be ball-bonded to the bond pad 123 of the first semiconductor die 120, and its other end can be stitch-bonded to the substrate 110. In addition, the first conductive wires 141 are stitch-bonded to leads when the substrate 110 is a lead frame, and are stitch-bonded to a wiring pattern when the substrate 110 is a printed circuit board, a circuit film or a circuit tape.

The pluralities of second conductive wires 142 electrically connect the bond pads 133 of the second semiconductor die 130 and the bond pads 123 of the first semiconductor die 120 to each other. For example, each one end of the second conductive wires 142 can be ball-bonded to the bond pads 133 of the second semiconductor die 130, and each other end thereof can be stitch-bonded to each bond pad 123 of the first semiconductor die 120.

Besides, each one end of pluralities of third conductive wires 143 can be ball-bonded to the bond pads 133 of the second semiconductor wires 130, and each other end thereof can be stitch-bonded to the substrate 110. In the present invention, of course, it is possible to omit the second conductive wires 142 and to provide only the third conductive wires 143. These first, second and third conductive wires 141, 142, 143 can consist of gold, aluminum, copper or their equivalents, but it is not intended to limit materials of the wires. Also, in accordance with the present invention, flip-chip bonding can be used in place of the wire bonding, but this is not intended to limit the bonding method.

The insulating gel 150 covers a certain region of the second surface 112 of the first semiconductor die 120 with predetermined thickness. That is, the insulating gel 150 completely covers the second semiconductor die 130, and has a substantially semicircular shape in section. Also, insulating gel 150 is formed in such a manner that its maximum thickness is equal to or higher than maximum height/heights of the second conductive wires 142 and/or the third conductive wires 143. This insulating gel 150 can consist of any one of a very soft silicon gel and its equivalents, but it is not intended to limit its material. In this way, material of the insulating gel 150 is very soft, so that external pressure, etc. can be easily transmitted to the second semiconductor die 130 through the insulating gel 150.

The encapsulant 160 serves to protect the substrate 110, the first and second semiconductor dies 120, 130, the first, second and third conductive wires 141, 142, 143, and the insulating gel 150 from the exterior environment by encapsulating them. Of course, an upper central region 151 of the insulating gel 150 is exposed to the exterior through the encapsulant 160. That is, the encapsulant 160 is formed with a first surface 161 bonded to the substrate 110, and a second substantially flat surface 162 at a distance from the second semiconductor die 130. Also, a hole 163 having a certain diameter is formed on the second surface 162 of the encapsulant 160 so as to expose the upper central region 151 of the insulating gel 150 to the exterior. Furthermore, the second surface 162 of the encapsulant 160 and the upper central region 151 of the insulating gel 150, which is exposed through the hole 163, are located in the same plane. Accordingly, external pressure or the like can be easily transmitted to the insulating gel 150 through the hole 163 of the encapsulant 160. Finally, general epoxy molding compounds may be used as the encapsulant 160, but embodiments in accordance with the present invention need not be limited to these.

Figure 2A:
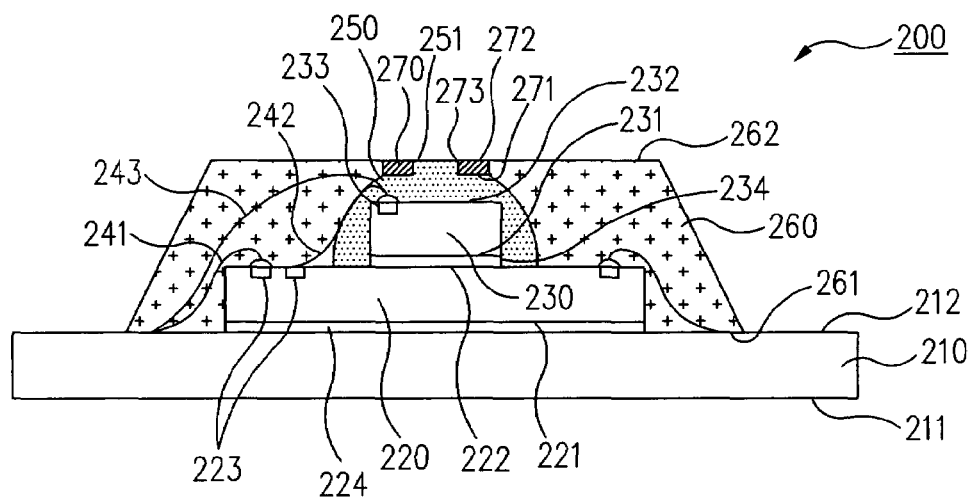
FIGS. 2A and 2B are a sectional view and a plan view of a semiconductor device in accordance with another embodiment of the present invention, respectively.
Figure 2B:
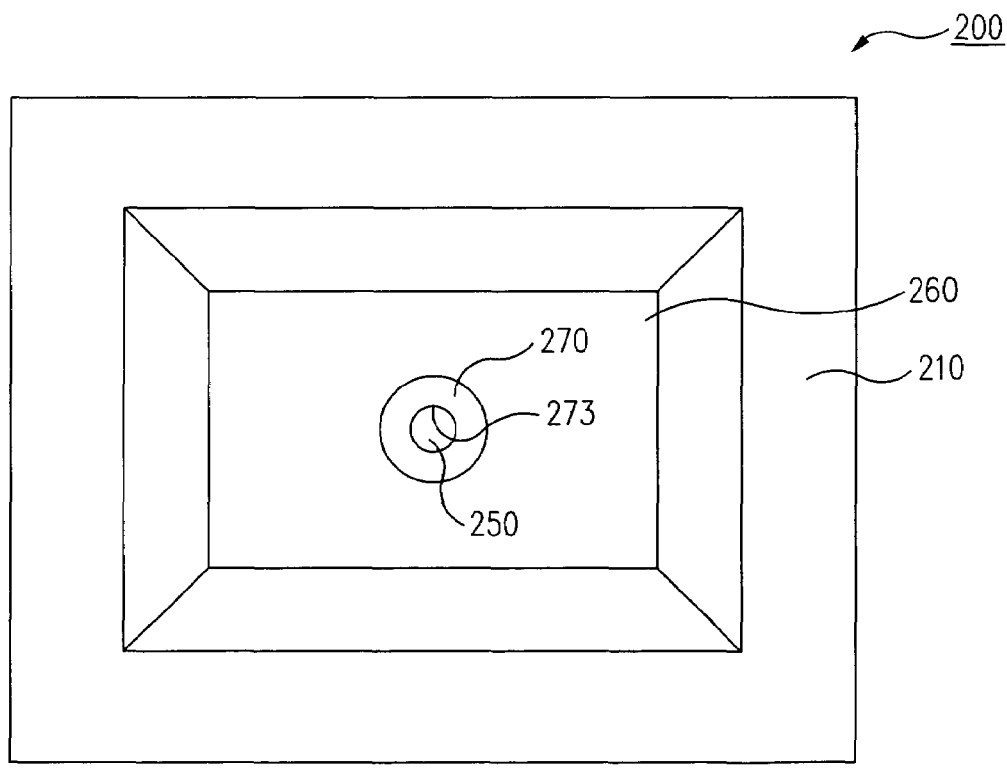

Referring to FIGS. 2A and 2B, a semiconductor device 200 in accordance with another embodiment of the present invention is shown in a sectional view and a plan view, respectively.

Herein, since the semiconductor device 200 is similar to the semiconductor device 100 as described above, differences between both semiconductor devices 100, 200 will be mainly described below. More particularly, the substrate 210, the first and second substantially flat surfaces 211, 212, the first semiconductor die 220, the first and second substantially flat surfaces 221, 222, the bond pads 223, the adhesive layer 224, the first and second substantially flat surfaces 231, 232, the bond pads 233, the adhesive layer 234, the first, second, and third conductive wires 241, 242, 243, the upper central region 251, and the first surface 261 of the semiconductor device 200 of FIGS. 2A and 2B are similar to the substrate 110, the first and second substantially flat surfaces 111, 112, the first semiconductor die 120, the first and second substantially flat surfaces 121, 122, the bond pads 123, the adhesive layer 124, the first and second substantially flat surfaces 131, 132, the bond pads 133, the adhesive layer 134, the first, second, and third conductive wires 141, 142, 143, the upper central region 151, and the first surface 161 of the semiconductor device 100 of FIGS. 1A and 1B, respectively.

As shown in the drawings, a dummy plate 270 is attached to an upper portion of an insulating gel 250 covering a second semiconductor die 230. The dummy plate 270 has a first substantially flat surface 271 and a second substantially flat surface 272 opposite to the first flat surface 271, and a hole 273 is formed between the first and second surfaces 271, 272. Also, the first surface 271 of the dummy plate 270 is bonded to the insulating gel 250, and an inner portion of the hole 273 is filled with and bonded to the insulating gel 250. Moreover, the second surface 272 of the dummy plate 270 and second surface 262 of the encapsulant 260 form the same plane. Consequently, the insulating gel 250 is exposed to the exterior through the hole 273 of the dummy plate 270. Of course, an upper central portion of the insulating gel 250 and the second surface 272 of the dummy plate 270 are located in the same plane or the upper central portion of the insulating gel 250 is located inside of the hole 273. Such a dummy plate 270 may consist of an epoxy-molding compound, but need not be limited to this material.

Referring to FIGS. 3A to 3D, a manufacturing method of a semiconductor device in accordance with one embodiment of the present invention is illustrated.

As shown in the drawings, the manufacturing method of a semiconductor device 100 according to the present invention comprises the operations of providing a first and a second mold 310, 320; bonding a first and a second semiconductor die 120, 130 to a substrate 110 and performing wire bonding; coating an insulating gel 150; and performing encapsulation.

Figure 3A:
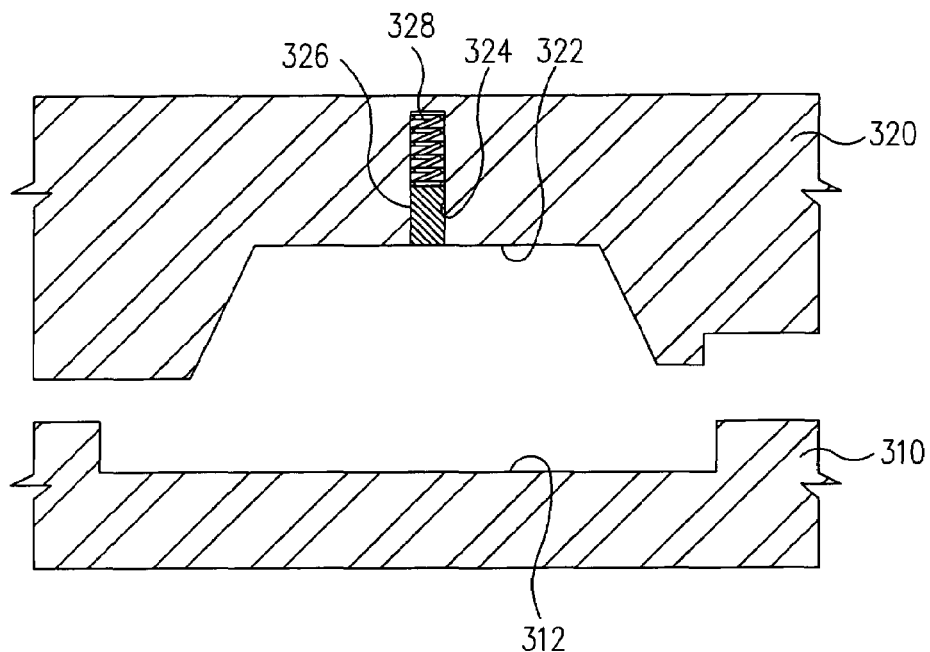
FIGS. 3A to 3D are views for successively explaining a manufacturing method of a semiconductor device in accordance with one embodiment of the present invention.

As shown in FIG. 3A, in the operation of providing the first and second molds 310, 320, the first mold 310 formed with a cavity 312 is first provided, the cavity 312 being enough for the substrate 110 to be seated therein. The second mold 320 formed with a cavity 322 is also provided over the first mold 310, the cavity 322 being enough to encapsulate the substrate 110. The second mold 320 has a through hole 324 at the center of the cavity 322, a movable pin 326 is inserted into the through hole 324, and a spring 328 is joined to an upper portion of the movable pin 326. That is, the movable pin 326 can be moved along a certain distance by upwardly compressing the spring 328.

Figure 3B:
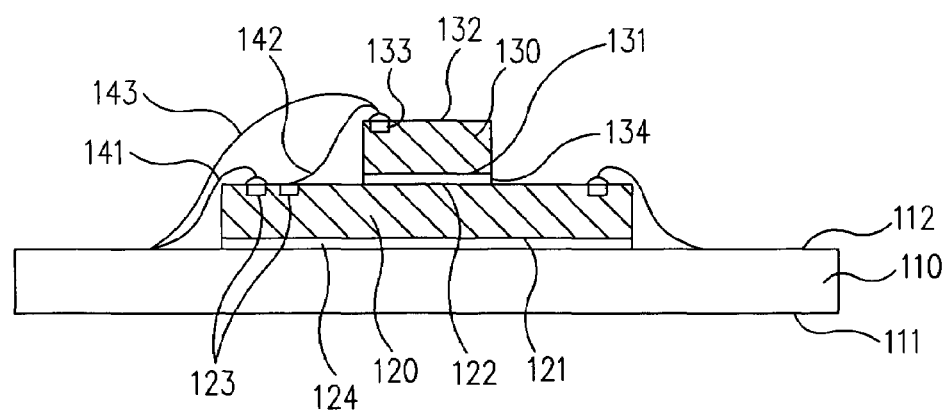

As shown in FIG. 3B, in the operation of bonding the first and second semiconductor dies 120, 130 to the substrate 110 and performing wire bonding, the first and second semiconductor dies 120, 130 is first bonded in succession to the substrate 110 by means of adhesives 124, 134. Thereafter, bond pads 123 of the first semiconductor die 120 are connected to the substrate 110 by using first conductive wires 141, and the bond pads 133 of the second semiconductor die 130 are connected to the bond pads 123 of the first semiconductor die 120 by using second conductive wires 142. Of course, the bond pads 133 of the second semiconductor die 130 may be connected to the substrate 110 by using third conductive wires 143, and the second conductive wires 142 may be omitted in some cases.

Figure 3C:
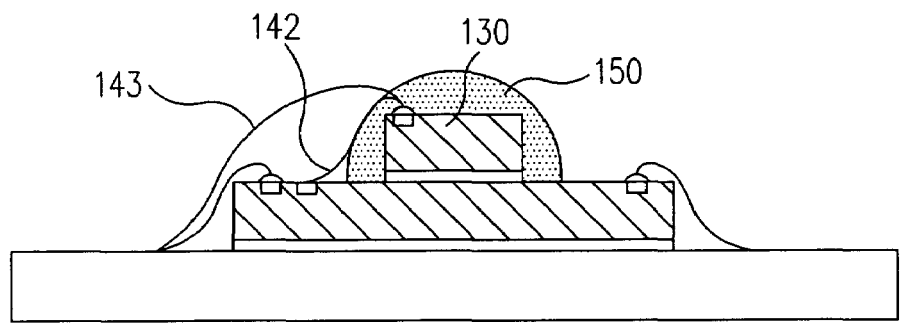

As shown in FIG. 3C, in the operation of coating the insulating gel 150, the second semiconductor die 130 is coated with the insulating gel 150. At this time, the insulating gel 150 must have maximum height equal to or higher than that of the second conductive wires 142 and/or that of the third conductive wires 143. Also, the maximum height of the insulating gel 150 must be sufficient so that the insulating gel 150 can close the through hole 324 when the substrate 110 is positioned between the first and second molds 310, 320. The insulating gel 150 takes a substantially semicircular shape in section by this coating operation. After the operation of coating the insulating gel 150, a curing operation is further performed so as to prevent the insulating gel 150 and the encapsulant 160 from being mixed with each other in the encapsulation operation as described later.

Figure 3D:
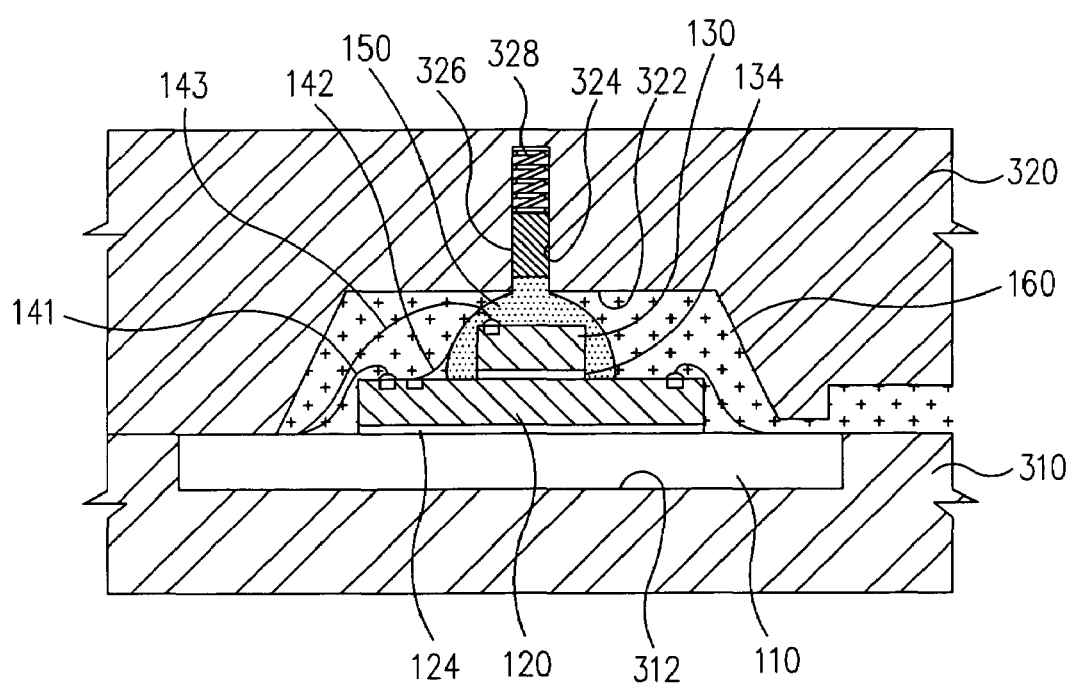

As shown in FIG. 3D, in the encapsulation operation, the substrate 110 going through the above-stated operations is seated within the cavity 312 of the first mold 310, and then a high-pressure and high-temperature encapsulant 160 is injected into the cavity 322 of the second mold 320. In this way, the semiconductor device is completed.

Figure 4A:
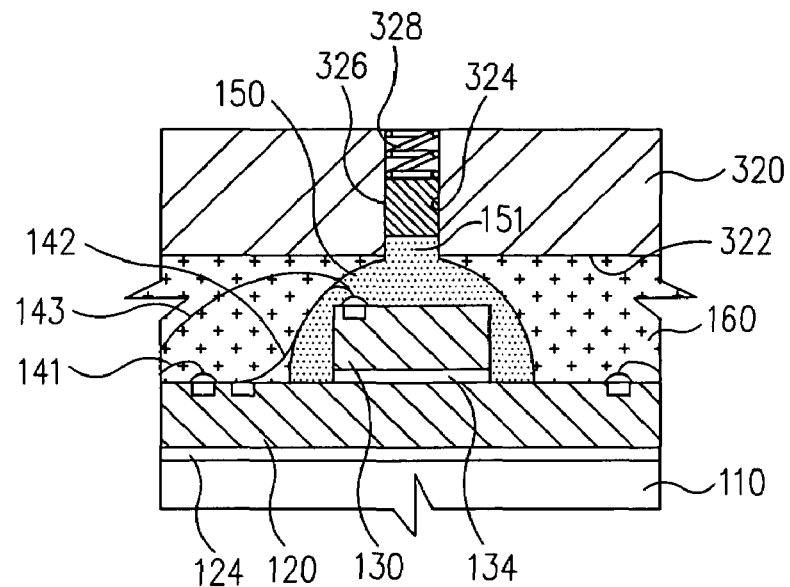
FIGS. 4A to 4C are views for successively explaining expansion and shrinkage states of an insulating gel before and after an encapsulation process in the manufacturing method of a semiconductor device in accordance with one embodiment of the present invention.
Figure 4B:
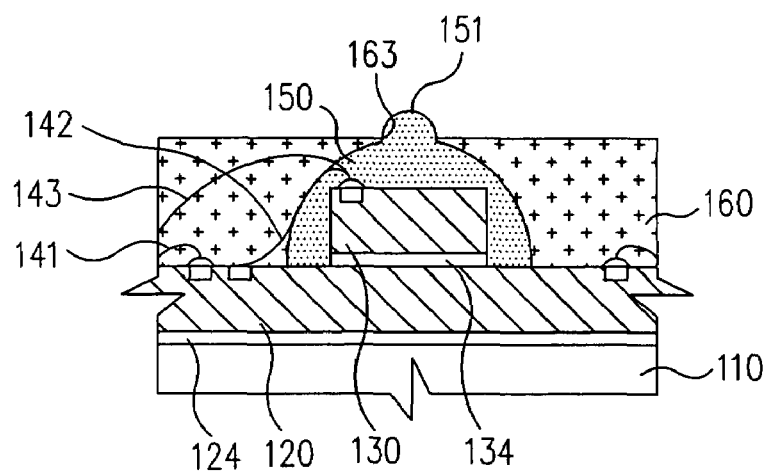
Figure 4C:
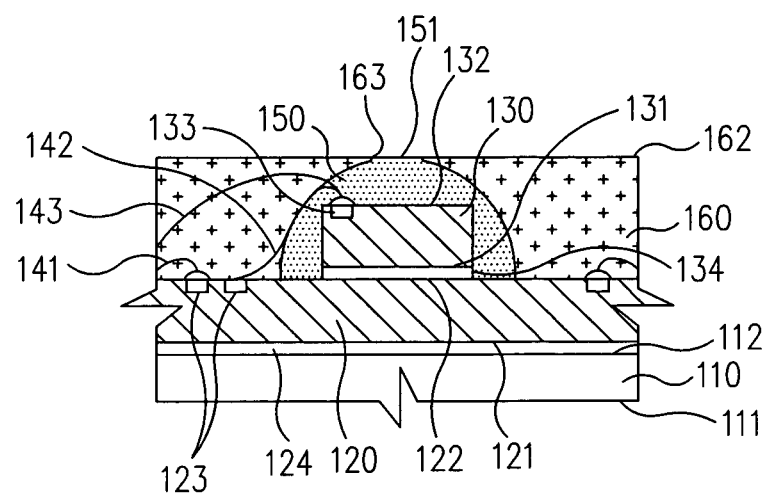

Referring to FIGS. 4A to 4C, expansion and shrinkage states of the insulating gel 150, which appear before and after the encapsulation operation of the manufacturing method according to one embodiment of the present invention, are successively shown.

At first, as shown in FIG. 4A, an encapsulant 160 having a temperature of about 150~200° C. is injected into the cavity 322 of the second mold 320. As a result, the encapsulant 160 covers the insulating gel 150 as well as the first semiconductor die 120 and the first, second and third conductive wires 141, 142, 143. Meanwhile, the insulating gel 150 is expanded due to high temperature of the encapsulant 160, and thus its upper central region 151 is expanded into the through hole 324 of the second mold 320. This makes the movable pin 326 within the through hole 324 compress the spring 328 and move upward by a certain distance.

Next, as shown in FIG. 4B, the insulating gel 150 is gradually shrunk again immediately after the substrate 110 is drawn out the first and second molds 310, 320. FIG. 4B shows that the upper central region 151 of the insulating gel 150 slightly protrudes outward from the hole 163 formed in the encapsulant 160.

Finally, as shown in FIG. 4C, the upper central region 151 of the insulating gel 150 is aligned with a surface of the encapsulant 160, that is, the upper central region 151 and the encapsulant surface form the same plane if the temperature of the encapsulant 160 falls to a normal temperature (25° C.). In this way, the size and shape of the insulating gel 150 exposed to the outside of the encapsulant 160 always become regular. Accordingly, not only is the reliability of the semiconductor device 100 improved, but also an inferior appearance of the semiconductor device 100 is prevented.

Referring to FIGS. 5A to 5E, a manufacturing method of a semiconductor device in accordance with another embodiment of the present invention is illustrated.

As shown in the drawings, the manufacturing method of a semiconductor device 200 in accordance with another embodiment comprises the operations of providing a first and a second mold 410, 420; bonding a first and a second semiconductor die 220, 230 to a substrate 210 and performing wire bonding; coating an insulating gel 250; seating a dummy plate 270; and performing encapsulation.

Figure 5A:
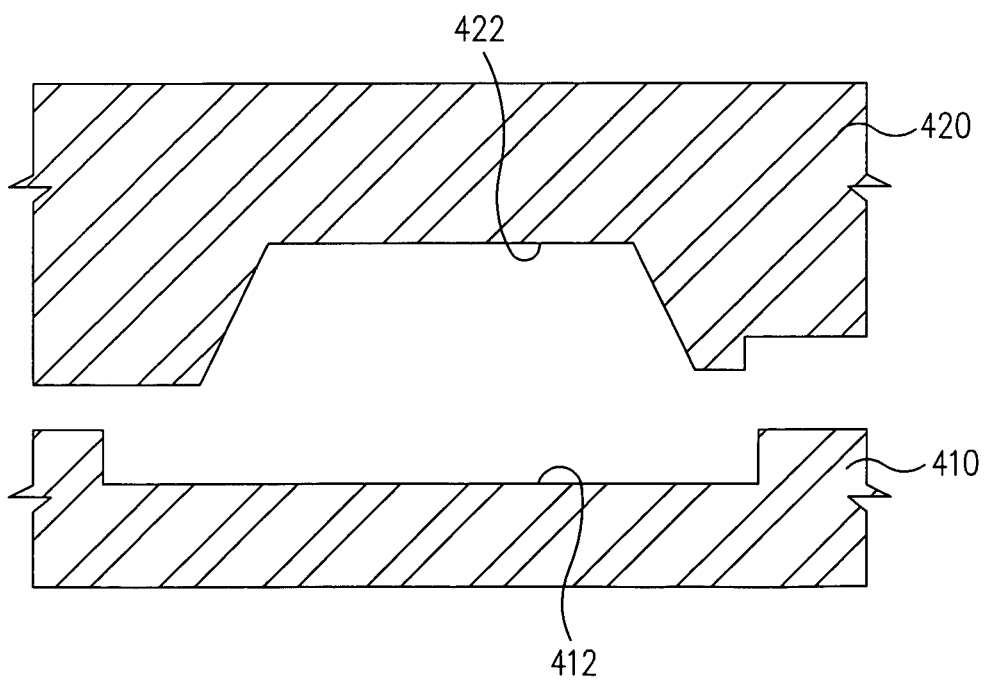
FIGS. 5A to 5E are views for successively explaining a manufacturing method of a semiconductor device in accordance with another embodiment of the present invention.

As shown in FIG. 5A, in the operation of providing the first and second molds 410, 420, the first mold 410 formed with a cavity 412 is first provided, the cavity 412 being enough for the substrate 210 to be seated therein. The second mold 420 formed with a cavity 422 is also provided over the first mold 410, the cavity 422 being enough to encapsulate the substrate 210.

Figure 5B:
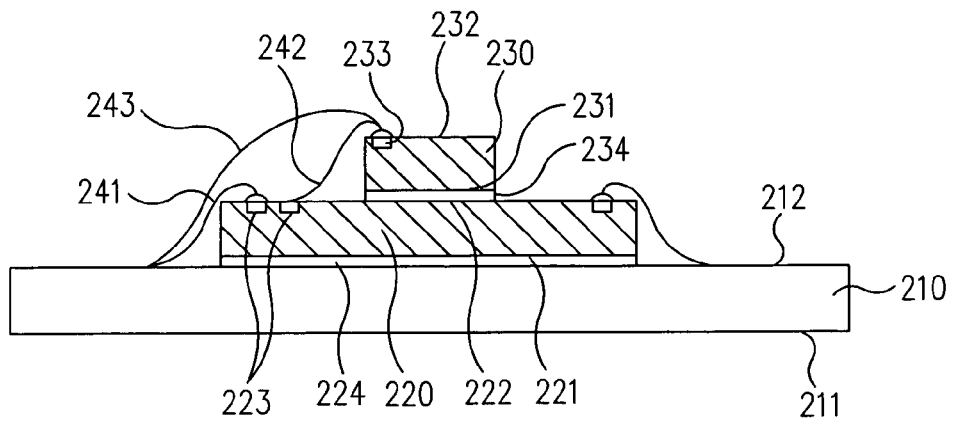

As shown in FIG. 5B, in the operation of bonding the first and second semiconductor dies 220, 230 to the substrate 210 and performing wire bonding, the first and second semiconductor dies 220, 230 are first bonded in succession to the substrate 210 by means of adhesives 224, 234. Thereafter, bond pads 223 of the first semiconductor die 220 are connected to the substrate 210 by using first conductive wires 241, and the bond pads 233 of the second semiconductor die 230 are connected to the bond pads 223 of the first semiconductor die 220 by using second conductive wires 242. Of course, the bond pads 233 of the second semiconductor die 230 may be connected to the substrate 210 by using third conductive wires 243.

Figure 5C:
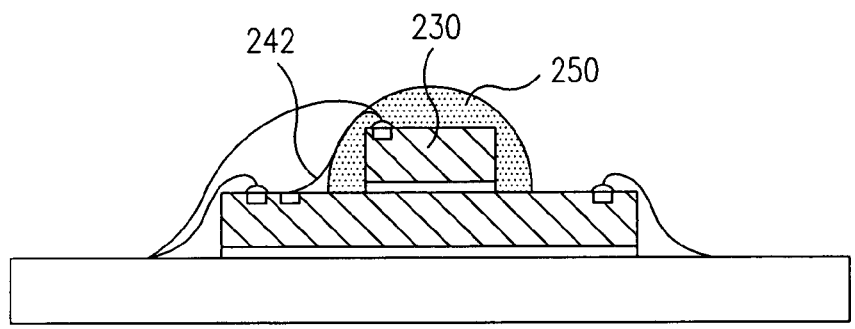

As shown in FIG. 5C, in the operation of coating the insulating gel 250, the second semiconductor die 230 is coated with the insulating gel 250. At this time, the insulating gel 250 must have maximum height equal to or higher than that of the second conductive wires 242. The insulating gel 250 takes a substantially semicircular shape in section by this coating operation. After the operation of coating the insulating gel 250, a curing operation is further performed so as to prevent the insulating gel 250 and the encapsulant 260 from being mixed with each other in the encapsulation operation as described later.

Figure 5D:
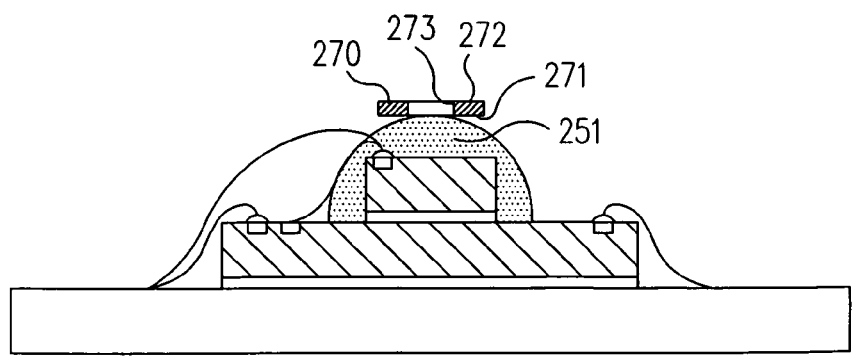

As shown in FIG. 5D, in the operation of seating the dummy plate 270, a substantially plate-like dummy plate 270 having a center hole 273 is seated in an upper central region 251 of the insulating gel 250. At this time, the dummy plate 270 must be as thick as it can be contacted with a base surface of the cavity 422 of the second mold 420 when the substrate 210 is positioned between the first and second molds 410, 420.

Figure 5E:
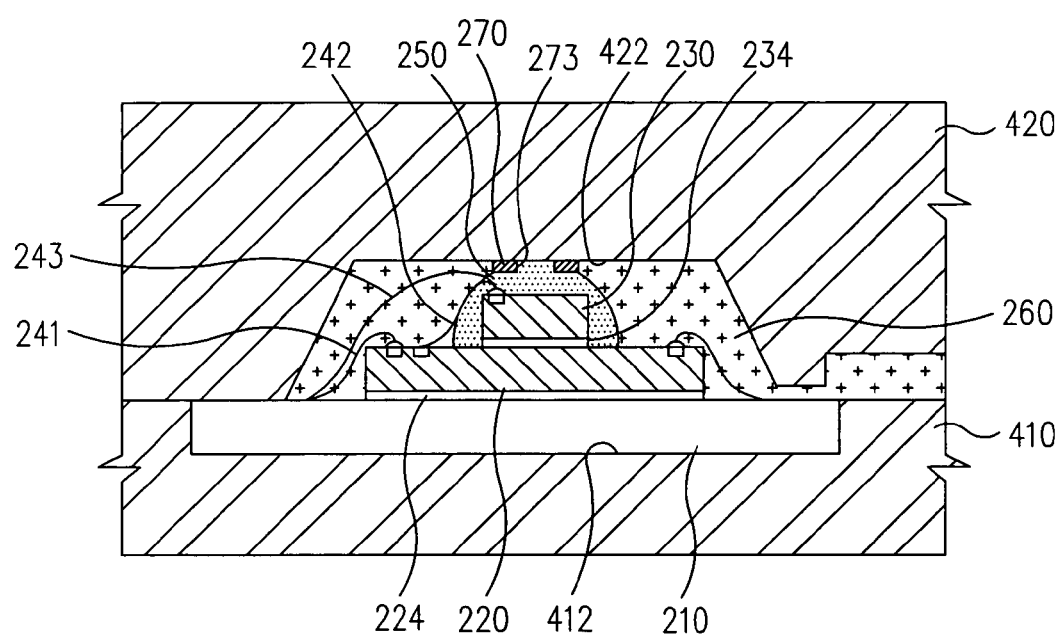

As shown in FIG. 5E, in the encapsulation operation, the substrate 210 going through the above-stated operations is seated within the cavity 412 of the first mold 410, and then a high-pressure and high-temperature encapsulant 260 is injected into the cavity 422 of the second mold 420. By this process, the encapsulant 260 covers the first semiconductor die 220, the insulating gel 250 and the dummy plate 270 on the substrate 210. Of course, a certain region of the insulating gel 250 is exposed to the exterior through the hole 273 of the dummy plate 270 after the encapsulation operation. In this way, the semiconductor device according to the present is completed.

Figure 6:
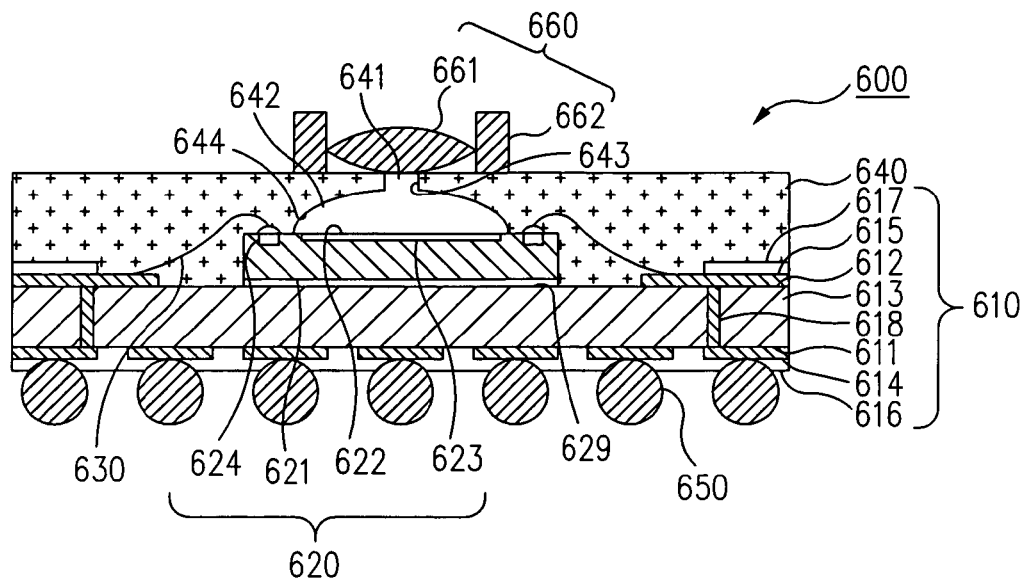
FIG. 6 is a sectional view of a semiconductor device in accordance with another embodiment of the present invention.

Referring to FIG. 6, a semiconductor device 600 in accordance with another embodiment of the present invention is shown in a sectional view.

As show in the drawing, the semiconductor device 600 in accordance with this embodiment includes a substrate 610 formed with electrically conductive patterns/traces, a semiconductor die 620 bonded to the substrate 610 and having an active sensing zone, pluralities of wires 630 electrically connecting the semiconductor die 620 to the substrate 610, an encapsulant 640 formed with a hole and a hollow portion communicating with each other for directing external incident light toward the active sensing zone, and pluralities of solder balls 650 fused to the substrate 610.

The substrate 610 also includes an insulative layer 613 having a first approximately planar surface 611 and a second approximately planar surface 612 opposite to the first surface 611. The first and second surfaces 611, 612 of the insulative layer 613 are formed with pluralities of electrically conductive patterns/traces 614, 615, respectively, and each surface of the electrically conductive patterns/traces 614, 615 is coated with a protective layer 616, 617, except for a region to which the solder ball 650 is fused. Of course, pluralities of electrically conductive vias 618 are formed through the insulative layer 613 so as to connect the electrically conductive patterns/traces 614 of the first surface 611 and the electrically conductive patterns/traces 615 of the second surface 612 to each other.

Although the substrate 610 is herein illustrated as a printed circuit board by way of example, the substrate 610 may be a circuit tape, a circuit film or equivalents thereof other than the printed circuit board, and its type is not limitative.

The semiconductor die 620 has a first approximately planar surface 621 and a second approximately planar surface 622 opposite to the first surface 621. Also, the second surface 622 of the semiconductor die 620 is formed with an active sensing zone 623 having a certain area. Moreover, the semiconductor die 620 has pluralities of bond pads 624 formed at an outer periphery of the active sensing zone 623. The first surface 621 of the semiconductor die 620 is bonded to the second surface 612 of the substrate 610 by means of a die attach material 629 such as an adhesive, an adhesive film/tape, an anisotropic conductive material (film/paste), an epoxy or equivalents thereof.

The pluralities of wires 630 electrically connect the bond pads 624 of the semiconductor die 620 and the electrically conductive patterns/traces 615 formed on the second surface 612 of the substrate 610 to each other. This wire 630 may be a gold wire, an aluminum wire, a copper wire or equivalents thereof, but its material need not be limited to these.

The encapsulant 640 encapsulates an upper surface of the substrate 610, the semiconductor die 620 and the pluralities of wires 630. The encapsulant 640 is also formed with a hole 641 of a certain diameter and a hollow portion 642 so that external light can be incident in the active sensing zone 623.

Here, the hole 641 is formed by an approximately circular vertical plane 643 extending downward from a top of the encapsulant 640. The hollow portion 642 communicates with the hole 641 and is formed by a curved plane 644 which gets larger in diameter. The hole 641 is smaller in area than the active sensing zone 623 whereas the hollow portion 642 is larger in area than the active sensing zone 623. The encapsulant 640 is composed of an epoxy, a plastic molding compound or equivalents thereof, but its material need not be limited to these.

The pluralities of solder balls 650 are fused to the pluralities of electrically conductive patterns/traces 614 formed on the first surface 611 of the substrate 610 to output an electrical signal of the semiconductor die 620 to an external device or input an electrical signal of an external device to the semiconductor die 620.

Meanwhile, a lens assembly 660 is coupled to an upper portion of the hole 641 of the encapsulant 640. That is, a lens 661 is provided so that external light can be incident in the active sensing zone 623 through the hole 641, and a housing 662 for fixing the lens 661 is joined to the lens along its circumference.

Figure 7:
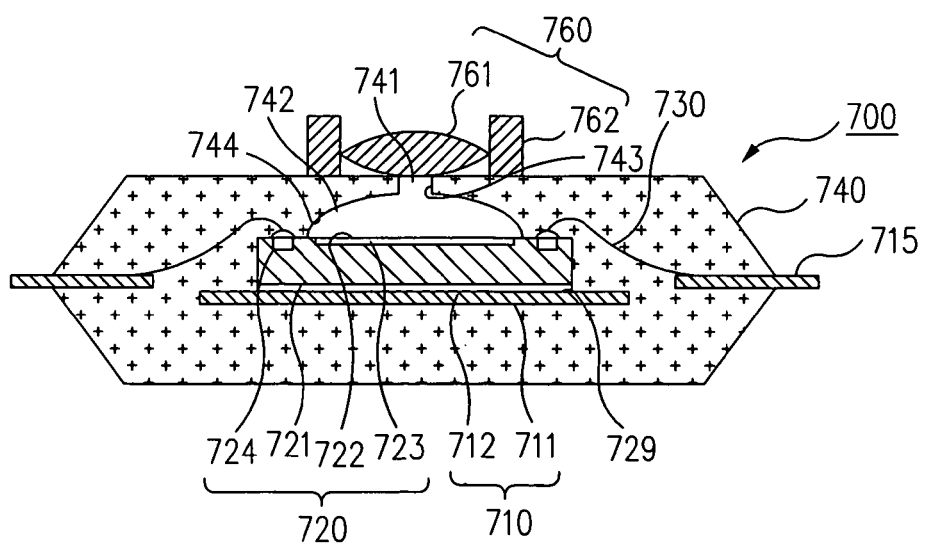
FIG. 7 is a sectional view of a semiconductor device in accordance with another embodiment of the present invention.

Referring to FIG. 7, a semiconductor device 700 in accordance with another embodiment of the present invention is shown in a sectional view.

As shown in the drawing, the semiconductor device in accordance with this embodiment includes a die paddle 710, pluralities of leads 715 positioned at an outer periphery of the die paddle 710, a semiconductor die 720 bonded to the die paddle 710 and having an active sensing zone 723, pluralities of wires 730 electrically connecting the semiconductor die 720 to the leads 715, and an encapsulant 740 formed with a hole and a hollow portion communicating with each other for directing external incident light toward the active sensing zone 723.

The die paddle 710 has a first approximately planar surface 711 and a second approximately planar surface 712 opposite to the first surface 711.

The pluralities of leads 715 are arranged at an outer periphery of the die paddle 710, and their thickness is equal or approximately similar to that of the die paddle 710.

Here, the die paddle 710 and the leads 715 are composed of ordinary copper, copper alloy, iron or equivalents thereof, but their materials need not be limited to these.

The semiconductor die 720 has a first approximately planar surface 721 and a second approximately planar surface 722 opposite to the first surface 721. Also, the second surface 722 of the semiconductor die 720 is formed with an active sensing zone 723 having a certain area. Moreover, the semiconductor die 720 has pluralities of bond pads 724 formed at an outer periphery of the active sensing zone 723. The first surface 721 of the semiconductor die 720 is bonded to the second surface 712 of the die paddle 710 by means of a die attach material 729.

The pluralities of wires 730 electrically connect the bond pads 724 of the semiconductor die 720 and the leads 715 to each other. This wire 730 may be a gold wire, an aluminum wire, a copper wire or equivalents thereof, but its material need not be limited to these.

The encapsulant 740 encapsulates the die paddle 710, the semiconductor die 720 and the pluralities of wires 730. The encapsulant 740 is also formed with a hole 741 of a certain diameter and a hollow portion 742 so that external light can be incident in the active sensing zone 723.

Here, the hole 741 is formed by an approximately circular vertical plane 743 extending downward from a top of the encapsulant 740. The hollow portion 742 communicates with the hole 741 and is formed by a curved plane 744 which gets larger in diameter. The hole 741 is smaller in area than the active sensing zone 723 whereas the hollow portion 742 is larger in area than the active sensing zone 723.

Of course, the leads 715 extends in such a manner that they partially project beyond side portions of the encapsulant 740 over a certain length, so that an electrical signal of the semiconductor die 720 is outputted to an external device or an electrical signal of an external device is inputted to the semiconductor die 720.

Meanwhile, a lens assembly 760 is coupled to an upper portion of the hole 741 of the encapsulant 740. That is, a lens 761 is provided so that external light can be incident in the active sensing zone 723 through the hole 741, and a housing 762 for fixing the lens 761 is joined to the lens along its circumference.

Referring to FIGS. 8A to 8F, a manufacturing method of a semiconductor device in accordance with another embodiment of the present invention is successively illustrated.

As shown in the drawings, the manufacturing method of a semiconductor device 600 in accordance with this embodiment comprises the operations of bonding a semiconductor die 620 to a substrate 610 and performing wire bonding; coating the semiconductor die 620 with a temporary gel 670; performing encapsulation using an encapsulant 640 while an exposed pin 680 is positioned on the temporary gel 670; removing the exposed pin 680; and removing the temporary gel 670.

Figure 8A:
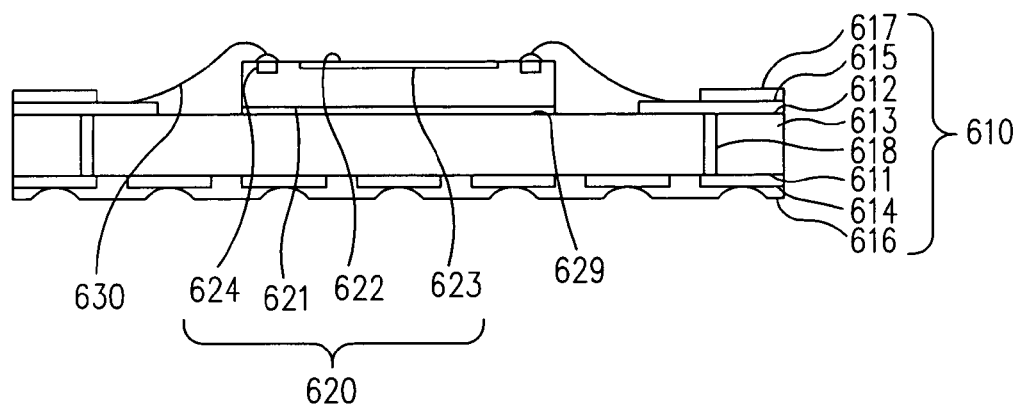
FIGS. 8A to 8F are views for successively explaining a manufacturing method of a semiconductor device in accordance with another embodiment of the present invention.

As shown in FIG. 8A, in the first operation of bonding and wire bonding of the semiconductor die 620, a substrate 610 formed with pluralities of electrically conductive patterns/traces 614, 615 is prepared and a semiconductor die 620 having an active sensing zone 623 is bonded to the substrate 610 by means of a die attach material 629. Thereafter, the semiconductor die 620 and the electrically conductive patterns/traces 615 of the substrate 610 are electrically connected to each other.

Here, the substrate 610 includes an insulative layer 613 having a first approximately planar surface 611 and a second approximately planar surface 612 opposite to the first surface 611. The pluralities of electrically conductive patterns/traces 614, 615 are formed on the first and second surfaces 611, 612 of the insulative layer 613, respectively.

The semiconductor die 620 also has a first approximately planar surface 621 and a second approximately planar surface 622 opposite to the first surface 621, the second surface 622 of the semiconductor die 620 is formed with an active sensing zone 623, and pluralities of bond pads 624 are formed at an outer periphery of the active sensing zone 623. The first surface 621 of the semiconductor die 620 is bonded to the second surface 612 of the substrate 610 by means of a die attach material 629.

Also, the pluralities of wires 630 electrically connect the bond pads 624 of the semiconductor die 620 and the electrically conductive patterns/traces 614, 615 formed on the substrate 610 (that is, the second surface 612 of the insulative layer 613) to each other.

Figure 8B:
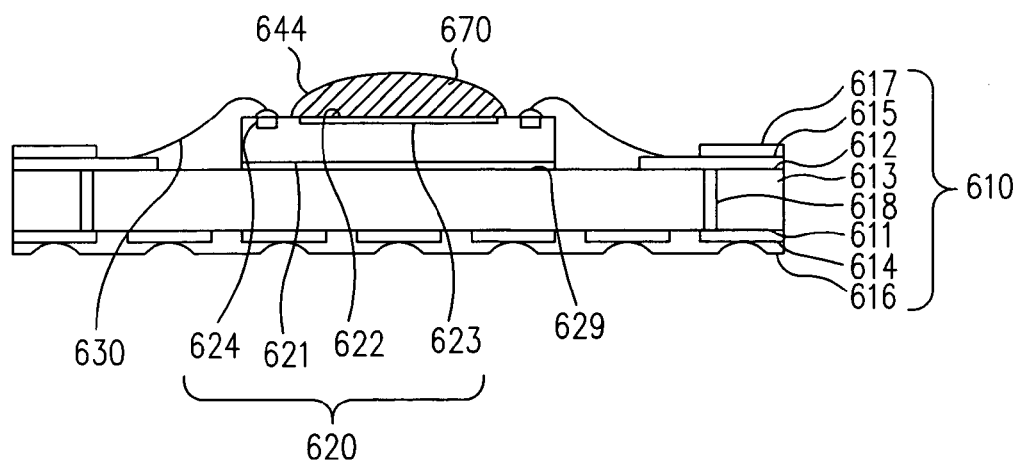

As shown in FIG. 8B, in the next operation of coating a temporary gel 670, the active sensing zone 623 of the semiconductor die 620 is coated with a certain amount of temporary gel 670. The temporary gel 670 is coated over a wider region than an area of the active sensing zone 623.

Here, it is suitable that water-soluble materials which do not impose a mechanical stress on the active sensing zone 623 are used as the temporary gel 670. For example, any one material selected from water-soluble polyvinyl alcohol (PVA), polyacrylamide, methylol urea resin, methylol melanin resin, carboxymethylcellulose (CMC) and equivalents thereof may be used as temporary gel 670, but its material need not be limited to these.

More concretely, when the temporary gel 670 is polyvinyl alcohol, a cure process becomes easier because polyvinyl alcohol can be photo-sensitively cured to ADC (ammonium dichromate). Moreover, polyvinyl alcohol can be applied as a photo-resist to photolithography, so that the temporary gel 670 is more easily coated.

Although the temporary gel 670 is herein described as water-soluble material, it is possible to use materials soluble in organic solvents in addition to water-soluble materials. However, it is not proper to use organic solvents which may impose a mechanical stress on the active sensing zone 623 after the temporary gel 670 is dissolved therein.

Figure 8C:
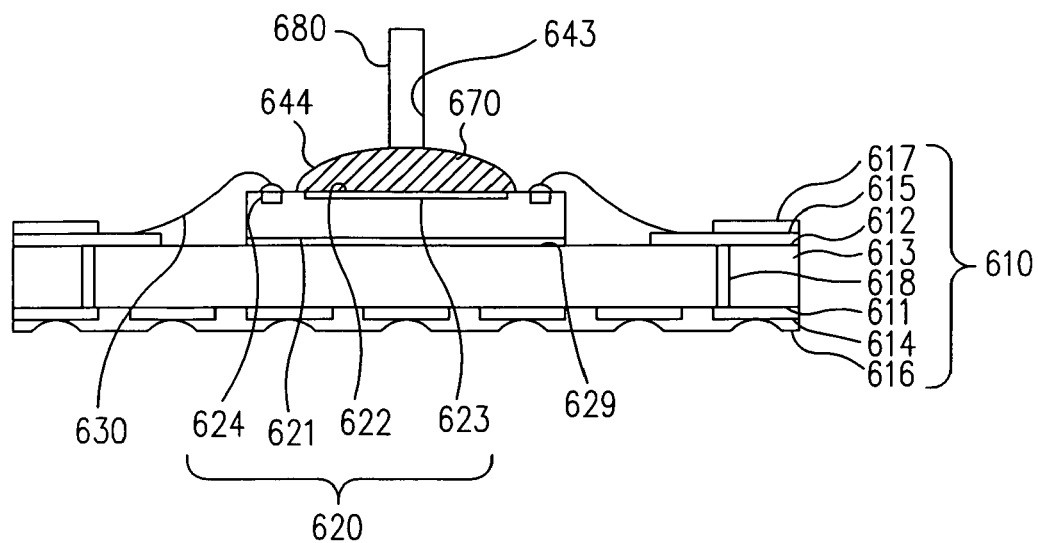

As shown in FIG. 8C, in the next encapsulation operation, an exposed pin 680 having a certain length is positioned on an upper surface of the temporary gel 670, and the substrate 610, the semiconductor die 620, the temporary gel 670, the exposed pin 680 and the pluralities of wires 630 are then encapsulated by an encapsulant 640.

In one embodiment, a longitudinal direction of the exposed pin 680 is approximately perpendicular to a surface of the active sensing zone 623.

Figure 8D:
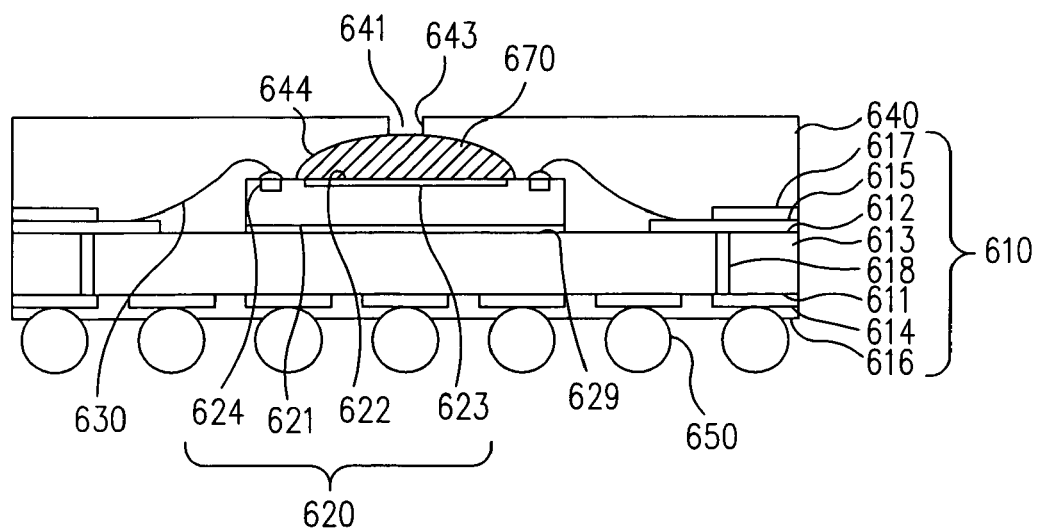

As shown in FIG. 8D, in the next operation of removing the exposed pin 680, the exposed pin 680 is removed from the encapsulant 640 to form a hole 641 of a certain diameter in the encapsulant 640. It is obvious that the temporary gel 670 is exposed to the exterior through the hole 641.

Here, pluralities of solder balls 650 can be fused to the electrically conductive patterns/traces 614 formed on the substrate 610 (that is, the first surface 611 of the insulative layer 613) before or after the removal process of the exposed pin 680.

Figure 8E:
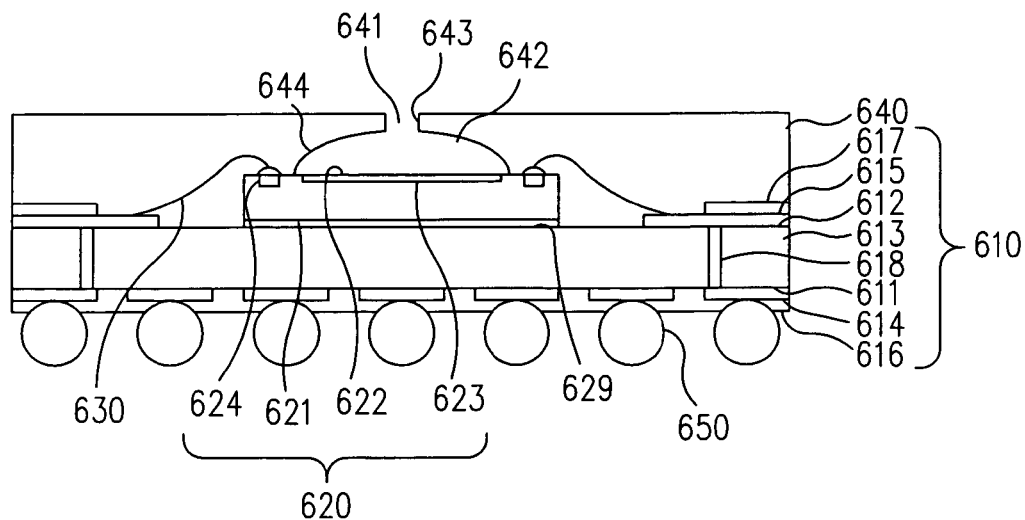

As shown in FIG. 8E, in the next operation of removing the temporary gel 670, water or organic solvent is injected into the hole 641 of the encapsulant 640 to remove the temporary gel 670. By removing the temporary gel 670, a hollow portion 642 communicating with the hole 641 is formed in the encapsulant 640. Of course, the hole 641 is formed by an approximately circular vertical plane 643 having a certain diameter, and the hollow portion 642 is formed by a curved plane 644 which gets larger in diameter.

Figure 8F:
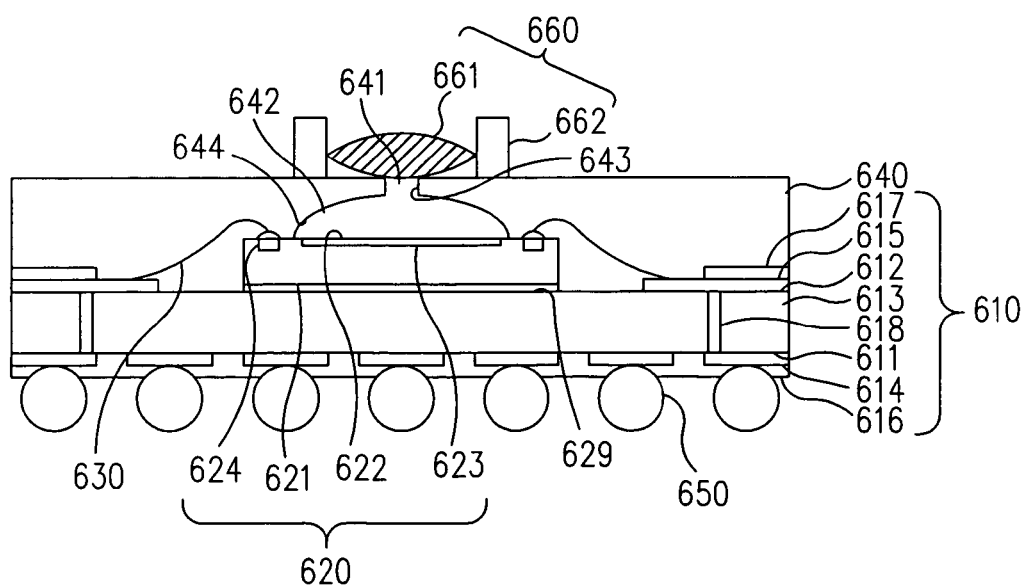

Finally, as shown in FIG. 8F, the manufacturing method can further comprise an operation of mounting a lens assembly 660. That is, a lens 661 and a housing 662 is fixed to the encapsulant 640 over the hole 641. The lens 661 and housing 662 serve to let external light be incident in the active sensing zone 623 and to prevent various external foreign matters from reaching the active sensing zone 623.

Referring to FIGS. 9A to 9F, a manufacturing method of a semiconductor device in accordance with another embodiment of the present invention is successively illustrated.

As shown in the drawings, the manufacturing method of a semiconductor device 700 in accordance with this embodiment comprises the operations of bonding a semiconductor die 720 to a die paddle 710 and performing wire bonding; coating the semiconductor die 720 with a temporary gel 770; performing encapsulation using an encapsulant 740 while an exposed pin 780 is positioned on the temporary gel 770; removing the exposed pin 780; and removing the temporary gel 770.

Figure 9A:
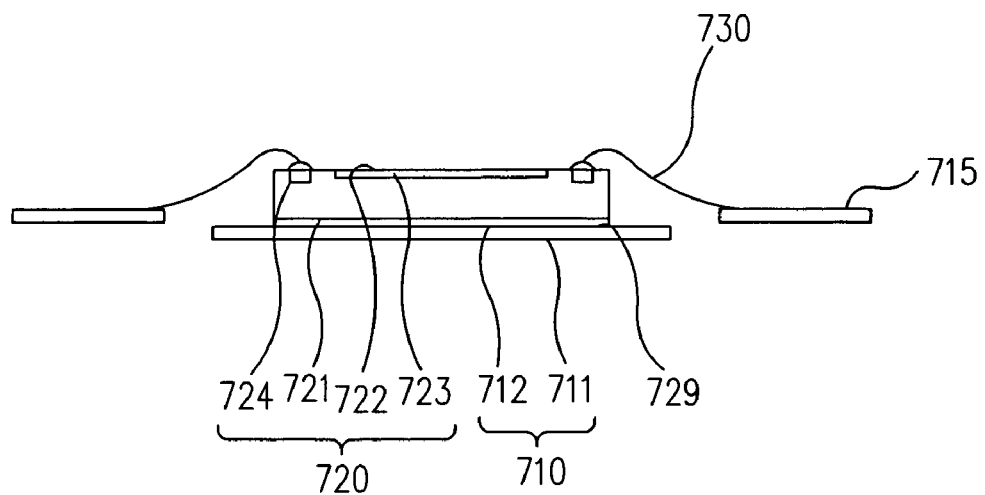
FIGS. 9A to 9F are views for successively explaining a manufacturing method of a semiconductor device in accordance with another embodiment of the present invention.

As shown in FIG. 9A, in the first operation of bonding and wire bonding of the semiconductor die 720, a lead frame having a die paddle 710 and pluralities of leads 715 is prepared and a semiconductor die 720 having an active sensing zone 723 is bonded to the die paddle 710 by means of a die attach material 729. Thereafter, the semiconductor die 720 and the leads 715 are electrically connected to each other.

Here, the die paddle 710 has a first approximately planar surface 711 and a second approximately planar surface 712 opposite to the first surface 711, and the pluralities of leads 715 are arranged at an outer periphery of the die paddle.

The semiconductor die 720 also has a first approximately planar surface 721 and a second approximately planar surface 722 opposite to the first surface 721, the second surface 722 of the semiconductor die 720 is formed with an active sensing zone 723, and pluralities of bond pads 724 are formed at an outer periphery of the active sensing zone 723. The first surface 721 of the semiconductor die 720 is bonded to the second surface 712 of the die paddle 710 by means of a die attach material 729.

Also, the pluralities of wires 730 electrically connect the bond pads 724 of the semiconductor die 720 and the leads 715 formed at the outer periphery of the die paddle 710 to each other.

Figure 9B:
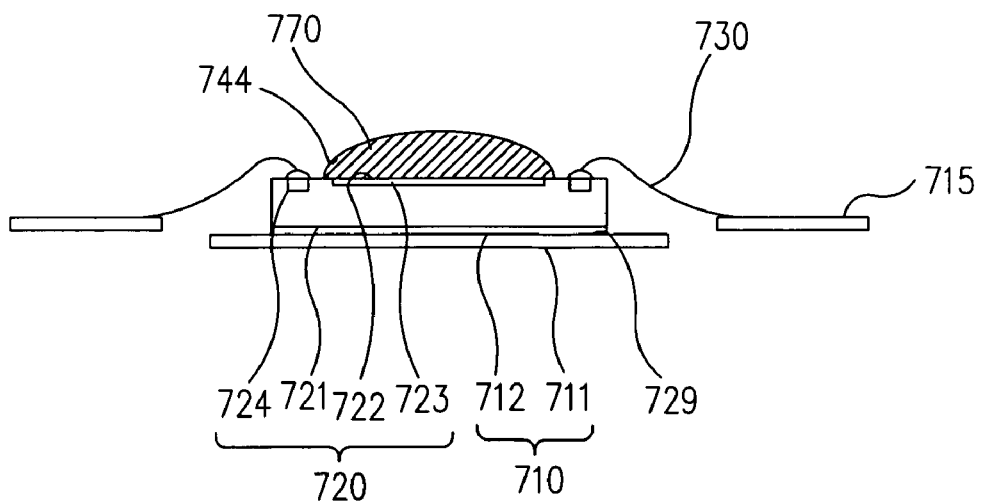

As shown in FIG. 9B, in the next operation of coating a temporary gel 770, the active sensing zone 723 of the semiconductor die 720 is coated with a certain amount of temporary gel 770. The temporary gel 770 is coated over a wider region than an area of the active sensing zone 723.

Here, it is suitable that water-soluble materials which do not impose a mechanical stress on the active sensing zone 723 are used as the temporary gel 770. For example, any one material selected from water-soluble polyvinyl alcohol (PVA), polyacrylamide, methylol urea resin, methylol melanin resin, carboxymethylcellulose (CMC) and equivalents thereof may be selectively used as temporary gel 770, but its material need not be limited to these.

More concretely, when the temporary gel 770 is polyvinyl alcohol, a cure process becomes easier because polyvinyl alcohol can be photo-sensitively cured to ADC (ammonium dichromate). Moreover, polyvinyl alcohol can be applied as a photo-resist to photolithography, so that the temporary gel 770 is more easily coated.

Although the temporary gel 770 is herein described as water-soluble material, it is possible to use materials soluble in organic solvents in addition to water-soluble materials. However, it is not proper to use organic solvents which may impose a mechanical stress on the active sensing zone 723 after the temporary gel 770 is dissolved therein.

Figure 9C:
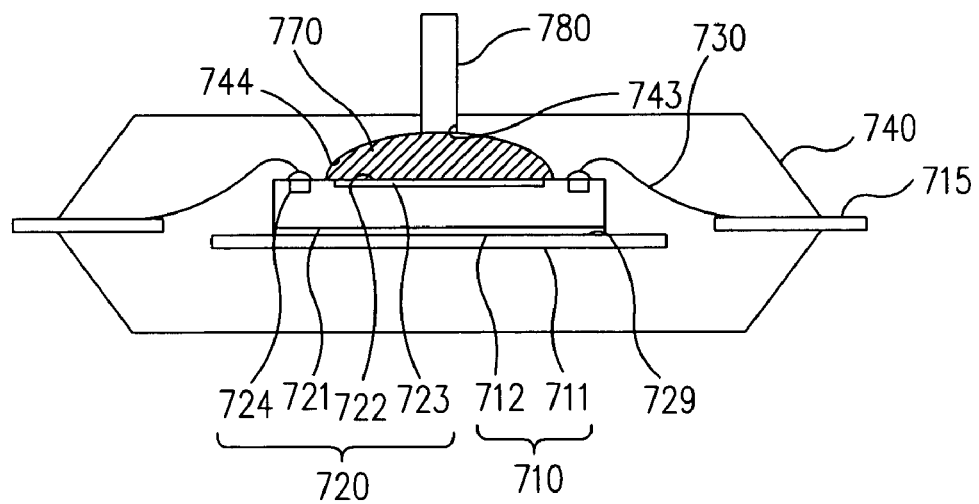

As shown in FIG. 9C, in the next encapsulation operation, an exposed pin 780 having a certain length is positioned on an upper surface of the temporary gel 770, and the die paddle 710, the semiconductor die 720, the temporary gel 770, the exposed pin 780 and the pluralities of wires 730 are then encapsulated by an encapsulant 740.

In one embodiment, a longitudinal direction of the exposed pin 780 is approximately perpendicular to a surface of the active sensing zone 723.

Figure 9D:
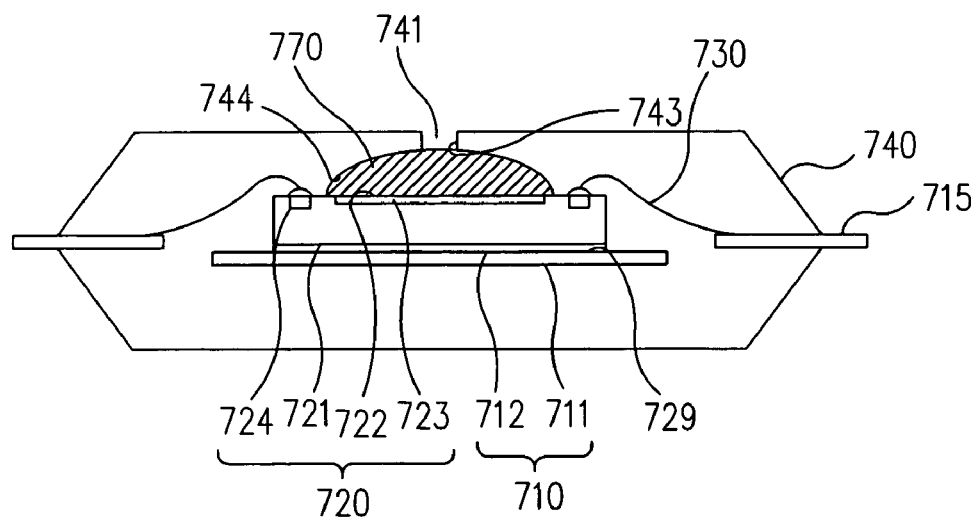

As shown in FIG. 9D, in the next operation of removing the exposed pin 780, the exposed pin 780 is removed from the encapsulant 740 to form a hole 741 of a certain diameter in the encapsulant 740. It is obvious that the temporary gel 770 is exposed to the exterior through the hole 741.

Figure 9E:
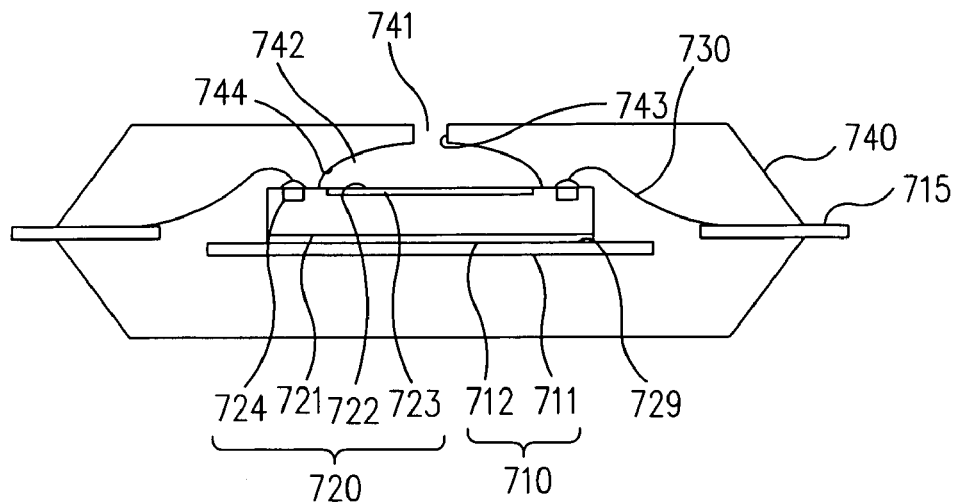

As shown in FIG. 9E, in the next operation of removing the temporary gel 770, water or organic solvent is injected into the hole 741 of the encapsulant 740 to remove the temporary gel 770. By removing the temporary gel 770, a hollow portion 742 communicating with the hole 741 is formed in the encapsulant 740. Of course, the hole 741 is formed by an approximately circular vertical plane 743 having a certain diameter, and the hollow portion 742 is formed by a curved plane 744 which gets larger in diameter.

Figure 9F:
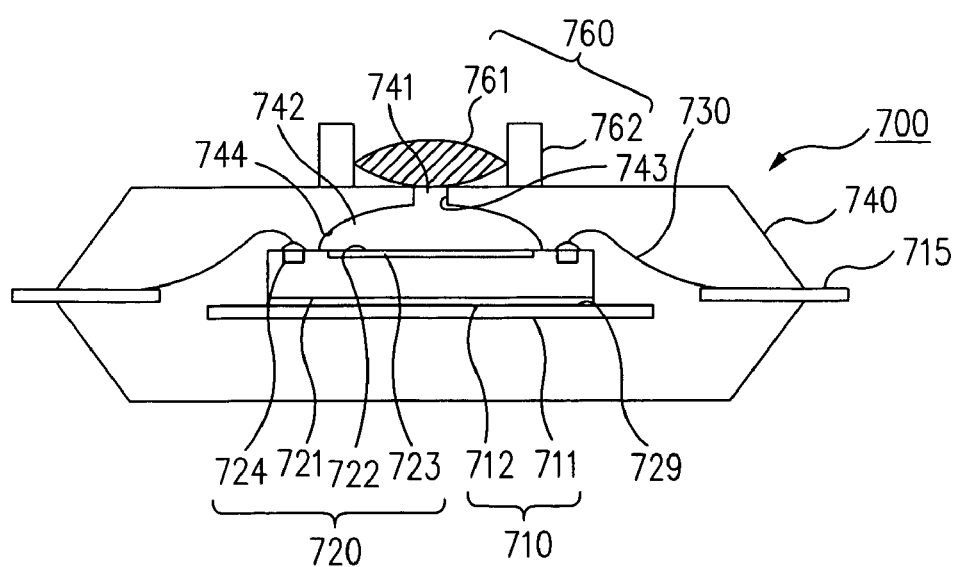

Finally, as shown in FIG. 9F, the manufacturing method can further comprise an operation of mounting a lens assembly 760. That is, a lens 761 and a housing 762 is fixed to the encapsulant 740 over the hole 741. The lens 761 and housing 762 serve to let external light be incident in the active sensing zone 723 and to prevent various external foreign matters from reaching the active sensing zone 723.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device comprising:
   a substrate having a first surface and a second surface opposite to the first surface;
   a first semiconductor die having a first surface and a second surface opposite to the first surface of the first semiconductor die, edges of the second surface of the first semiconductor die being formed with pluralities of bond pads and the first surface of the first semiconductor die being bonded to the second surface of the substrate by means of a first adhesive layer;
   a second semiconductor die having a first surface and a second surface opposite to the first surface of the second semiconductor die, edges of the second surface of the second semiconductor die being formed with pluralities of bond pads, and the first surface of the second semiconductor die being bonded to the second surface of the first semiconductor die by means of a second adhesive layer;
   pluralities of first conductive wires for electrically connecting the bond pads of the first semiconductor die and the substrate to each other;
   pluralities of second conductive wires for electrically connecting the bond pads of the second semiconductor die and the bond pads of the first semiconductor die to each other;
   an insulating gel being coated on the second surface of the first semiconductor die and completely covering the second semiconductor die; and
   an encapsulant for protecting the substrate, the first and second semiconductor dies, the first and second conductive wires, and the insulating gel from the exterior, the encapsulant being formed in such a manner that a certain region of the insulating gel is exposed to the exterior.

2. The semiconductor device according to claim 1, wherein the first semiconductor die has a width larger than that of the second semiconductor die.

3. The semiconductor device according to claim 1, further comprising pluralities of third conductive wires for electrically connecting the bond pads of the second semiconductor die and the substrate to each other.

4. The semiconductor device according to claim 1, wherein the second semiconductor die is a pressure sensor.

5. The semiconductor device according to claim 1, wherein the insulating gel covers the second semiconductor die in a shape of semicircle in section, and has a height equal to or higher than that of the second conductive wires.

6. The semiconductor device according to claim 1, wherein the insulating gel is a silicon gel.

7. The semiconductor device according to claim 1, wherein the encapsulant has a first surface bonded to surfaces of the substrate, the first semiconductor die and the insulating gel, and a second surface located at a distance from the second semiconductor die and formed with a hole to expose an upper central region of the insulating gel to the exterior.

8. The semiconductor device according to claim 7, wherein the second surface of the encapsulant and the upper central region of the insulating gel exposed through the hole form the same plane.

9. The semiconductor device according to claim 1, wherein a dummy plate is further bonded to an upper portion of the insulating gel.

10. The semiconductor device according to claim 9, wherein the dummy plate has a first surface and a second surface opposite to the first surface of the dummy plate, a hole is formed between the first and second surfaces of the dummy plate, and the insulating gel is inserted into and bonded to the hole.

11. A semiconductor device comprising:
a substrate including an insulative layer, the substrate having a first surface and a second surface opposite to the first surface, the first and second surfaces of the substrate being formed with pluralities of electrically conductive patterns/traces;
a semiconductor die having a first surface and a second surface opposite to the first surface of the semiconductor die, the second surface of the semiconductor die being formed with an active sensing zone and with pluralities of bond pads at an outer periphery thereof, the first surface of the semiconductor die being bonded to the second surface of the substrate by means of a die attach material;
pluralities of wires electrically connecting the bond pads of the semiconductor die and the electrically conductive patterns/traces of the substrate to each other;
an encapsulant encapsulating the substrate, the semiconductor die and the pluralities of wires, and being formed with a hole and a hollow portion communicating with each other so as to expose the active sensing zone of the semiconductor die to the exterior; and
pluralities of solder balls being fused to the electrically conductive patterns/traces formed on the first surface of the substrate.

12. The semiconductor device according to claim 11, further comprising:
a lens assembly being coupled to the encapsulant over the hole.

13. The semiconductor device according to claim 11, further comprising a temporary gel filling the hollow portion.

14. A semiconductor device comprising:
a substrate having a first surface and a second surface opposite to the first surface;
a first semiconductor die having a first surface and a second surface opposite to the first surface of the first semiconductor die, the first surface of the first semiconductor die being bonded to the second surface of the substrate;
a pressure sensor having a first surface and a second surface opposite to the first surface of the pressure sensor, the first surface of the pressure sensor being bonded to the second surface of the first semiconductor die;
an insulating gel completely covering the pressure sensor; and
an encapsulant for protecting the substrate, the first semiconductor die and the pressure sensor, a region of the insulating gel being exposed to the exterior through the encapsulant.

15. The semiconductor device of claim 14 wherein the encapsulant has a surface located at a distance from the pressure sensor, the surface of the encapsulant being formed with a hole to expose the region of the insulating gel to the exterior.

16. The semiconductor device according to claim 14, wherein a dummy plate is further bonded to the insulating gel.

17. The semiconductor device according to claim 16, wherein the dummy plate has a first surface and a second surface opposite to the first surface of the dummy plate, a hole is formed between the first and second surfaces of the dummy plate, and the insulating gel is inserted into and bonded to the hole.

* * * * *